US010266945B2

(12) United States Patent
Yamashita

(10) Patent No.: US 10,266,945 B2
(45) Date of Patent: Apr. 23, 2019

(54) GAS MIXING DEVICE AND SUBSTRATE PROCESSING APPARATUS

(71) Applicant: TOKYO ELECTRON LIMITED, Tokyo (JP)

(72) Inventor: Jun Yamashita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 121 days.

(21) Appl. No.: 15/622,545

(22) Filed: Jun. 14, 2017

(65) Prior Publication Data

US 2017/0362704 A1 Dec. 21, 2017

(30) Foreign Application Priority Data

Jun. 20, 2016 (JP) ................................ 2016-121947

(51) Int. Cl.
*C23C 16/455* (2006.01)
*C23C 16/30* (2006.01)
(Continued)

(52) U.S. Cl.
CPC .......... *C23C 16/45514* (2013.01); *B01F 3/02* (2013.01); *B01F 3/026* (2013.01); *B01F 5/0068* (2013.01); *C23C 16/308* (2013.01); *C23C 16/4412* (2013.01); *C23C 16/45512* (2013.01); *C23C 16/45531* (2013.01); *C23C 16/45544* (2013.01); *C23C 16/45565* (2013.01); *B01F 2005/0014* (2013.01); *B01F 2215/0096* (2013.01)

(58) Field of Classification Search
CPC ........ C23C 16/45514; C23C 16/45565; C23C 16/45512; C23C 16/308; C23C 16/45531; C23C 16/45544; C23C 16/4412; B01F 3/02; B01F 3/026; B01F 5/0068; B01F 2215/0096; B01F 2005/0014
See application file for complete search history.

(56) References Cited

U.S. PATENT DOCUMENTS 3,373,562 A * 3/1968 Wormser .................. F23R 3/18 366/337
3,428,407 A * 2/1969 Honda et al. ............. F23D 5/00 431/249

(Continued)

FOREIGN PATENT DOCUMENTS

FR 2410128 A1 * 6/1979 ................ B01F 3/02
JP 2000260763 A 9/2000
JP 2003133300 A 5/2003

*Primary Examiner* — Jeffrie R Lund
(74) *Attorney, Agent, or Firm* — Nath, Goldberg & Meyer; Jerald L. Meyer

(57) ABSTRACT

A gas mixing device includes: a cylindrical portion including an upper surface which is closed; a gas outflow passage formed in a central portion of a bottom surface of the cylindrical portion, and extends downward; a plurality of gas stream guide walls disposed to be spaced apart from each other in a circumferential direction along an edge of an opening formed by the gas outflow passage in the bottom surface, and installed to be rotationally symmetrical to a center of the cylindrical portion, the gas stream guide walls protruding toward the upper surface; and a gas inlet part installed between the gas stream guide walls and an inner peripheral surface of the cylindrical portion, and into which a gas to be mixed flows.

13 Claims, 14 Drawing Sheets

(51) Int. Cl.

| | |
|---|---|
| ***B01F 3/02*** | (2006.01) |
| ***C23C 16/44*** | (2006.01) |
| ***B01F 5/00*** | (2006.01) |

(56) References Cited

U.S. PATENT DOCUMENTS

| | | | | |
|---|---|---|---|---|
| 3,538,865 | A * | 11/1970 | Lausmann | F23G 5/36 110/119 |
| 4,648,787 | A * | 3/1987 | Brunig | B01F 3/02 415/224.5 |
| 5,887,424 | A * | 3/1999 | Kuroshita | B01F 3/02 181/262 |
| 2002/0172905 | A1 * | 11/2002 | Ruck | F23C 7/002 431/354 |
| 2003/0005886 | A1 * | 1/2003 | Park | C23C 16/4411 118/725 |
| 2007/0264441 | A1 * | 11/2007 | Ishibashi | H01J 37/32192 427/488 |
| 2009/0003127 | A1 * | 1/2009 | Beckmann | B01D 53/8631 366/340 |
| 2009/0029564 | A1 * | 1/2009 | Yamashita | H01J 37/32192 438/788 |
| 2009/0047426 | A1 | 2/2009 | Park et al. | |
| 2010/0239756 | A1 * | 9/2010 | Yamashita | H01J 37/32192 427/248.1 |
| 2012/0314526 | A1 * | 12/2012 | Shah | B01F 3/02 366/101 |
| 2017/0362704 | A1 * | 12/2017 | Yamashita | B01F 3/02 |
| 2017/0372914 | A1 * | 12/2017 | Yamashita | H01J 37/3244 |

* cited by examiner

N2
TiCl4
NH3
O2
61
62
63
64
65
66
V1
V2
V3
V4
V5
V6
M1
M2
M3
M4
M5
M6
45A
45B
45C
40
41
4
52
53
54
57
5
50
51
W
22
2

GAS MIXING DEVICE AND SUBSTRATE PROCESSING APPARATUS

CROSS-REFERENCE TO RELATED APPLICATION

This application claims the benefit of Japanese Patent Application No. 2016-121947, filed on Jun. 20, 2016, in the Japan Patent Office, the disclosure of which is incorporated herein in its entirety by reference.

TECHNICAL FIELD

The present disclosure relates to a gas mixing device and a substrate processing apparatus for mixing plural kinds of gases.

BACKGROUND

In a semiconductor process, an apparatus for processing a substrate with a process gas, for example, a film forming apparatus, is often required to uniformly mix plural kinds of process gases and supply the mixture to a substrate. As a method of forming a film on a semiconductor wafer (hereinafter, referred to as a "wafer") as a substrate, a method of sequentially supplying a raw material gas and a reaction gas reacting with the raw material gas to the wafer to deposit a molecular layer of a reaction product on a surface of the wafer so as to obtain a thin film, a so-called atomic layer deposition (ALD) method or the like, is known. In the ALD method, a first gas and a second gas, which are film forming gases, are alternately supplied in a state in which a carrier gas flows. In order to obtain desirable in-plane uniformity of the wafer in the film forming process, it is necessary that the film forming gases are supplied to the substrate in a state of being uniformly mixed with the carrier gas.

As methods of mixing such a plurality of gases, for example, there is known a technique of uniformly mixing a first gas flow and a second gas flow as a spiral gas flow mixture. Further, there is known a technique of allowing a gas to flow to one side in a circumferential direction, when viewed from a gas outflow passage, and then bending it to be perpendicular to the gas outflow passage side to allow the gas to flow toward a periphery of the gas outflow passage so as to form a swirl flow. In addition, there is known a technique of supplying a raw material gas to a central part of a gas mixing part and uniformly supplying a dilution gas from its periphery in the same flow direction as that of the raw material gas to pass through a gas diffusion part so as to uniformly diffuse the raw material gas and mix them.

However, these known mixing techniques are unsuitable for reducing gas bias in a wide range of flow ratio. In particular, when a small flow rate of the film forming gas is supplied to a large flow rate of the gas, for example, a carrier gas, it is difficult to promote equalization of gases. Further, when a static mixer is installed in the gas mixing device to forcibly mix gases, the pressure loss is increased in the gas mixing device. Since, in order to sequentially supply plural kinds of gases, while substituting the interior of a processing vessel by a purge gas as in the ALD method, it is necessary to allow a large flow rate of the gas to flow at a high speed, using the static mixer is not suitable for the ALD method.

In addition, a small amount of gas is easily mixed by making a flow path of mixed gas long, but when the flow path of mixed gas is long, the temperature of the gas is lowered, and for example, in a certain type of precursor, liquefaction may occur due to a decrease in temperature to cause the generation of particles. Thus, it is required to shorten the flow path of the mixed gas as much as possible.

SUMMARY

Some embodiments of the present disclosure provide a technique of uniformly mixing gases, in mixing plural kinds of gases.

According to one embodiment of the present disclosure, there is provided a gas mixing device for mixing plural kinds of gases, including: a cylindrical portion including an upper surface which is closed; a gas outflow passage which is formed in a central portion of a bottom surface of the cylindrical portion, and extends downward; a plurality of gas stream guide walls which are disposed to be spaced apart from each other in a circumferential direction along an edge of an opening formed by the gas outflow passage in the bottom surface, and which are installed to be rotationally symmetrical to a center of the cylindrical portion, the plurality of gas stream guide walls protruding toward the upper surface; and a gas inlet part installed between the plurality of gas stream guide walls and an inner peripheral surface of the cylindrical portion, and into which a gas to be mixed flows, wherein, when viewed in one direction of a clockwise direction and a counterclockwise direction in the circumferential direction of the cylindrical portion, if the one direction is defined as a front and the other direction is defined as a rear, the plurality of gas stream guide walls guide the gas introduced between the inner peripheral surface of the cylindrical portion and the plurality of gas stream guide walls to the gas outflow passage along outer peripheral surfaces of the plurality of gas stream guide walls, and the plurality of gas stream guide walls is bent toward the center of the cylindrical portion in a front direction so as to form a swirl flow.

According to another embodiment of the present disclosure, there is provided a substrate processing apparatus, including: the aforementioned gas mixing device in which different process gases are introduced from different positions so as to be mixed; a processing vessel to which the process gas mixed in the gas mixing device is supplied; a mounting part installed in the processing vessel, and configured to mount a substrate to be processed by the process gas; and an exhaust part configured to evacuate the interior of the processing vessel.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A configuration of a film forming apparatus as one example of a substrate processing apparatus employing a gas mixing device according to an embodiment of the present disclosure, will be described. The film forming apparatus is constituted by an apparatus for sequentially supplying a titanium chloride ($TiCl_4$) gas, an ammonia ($NH_3$) gas, and an oxygen ($O_2$) gas to a surface of a wafer W to form a titanium oxynitride (TiON) film by a so-called ALD method. Further, in the present disclosure, it is assumed that a carrier gas is also included in a process gas.

Figure 1:
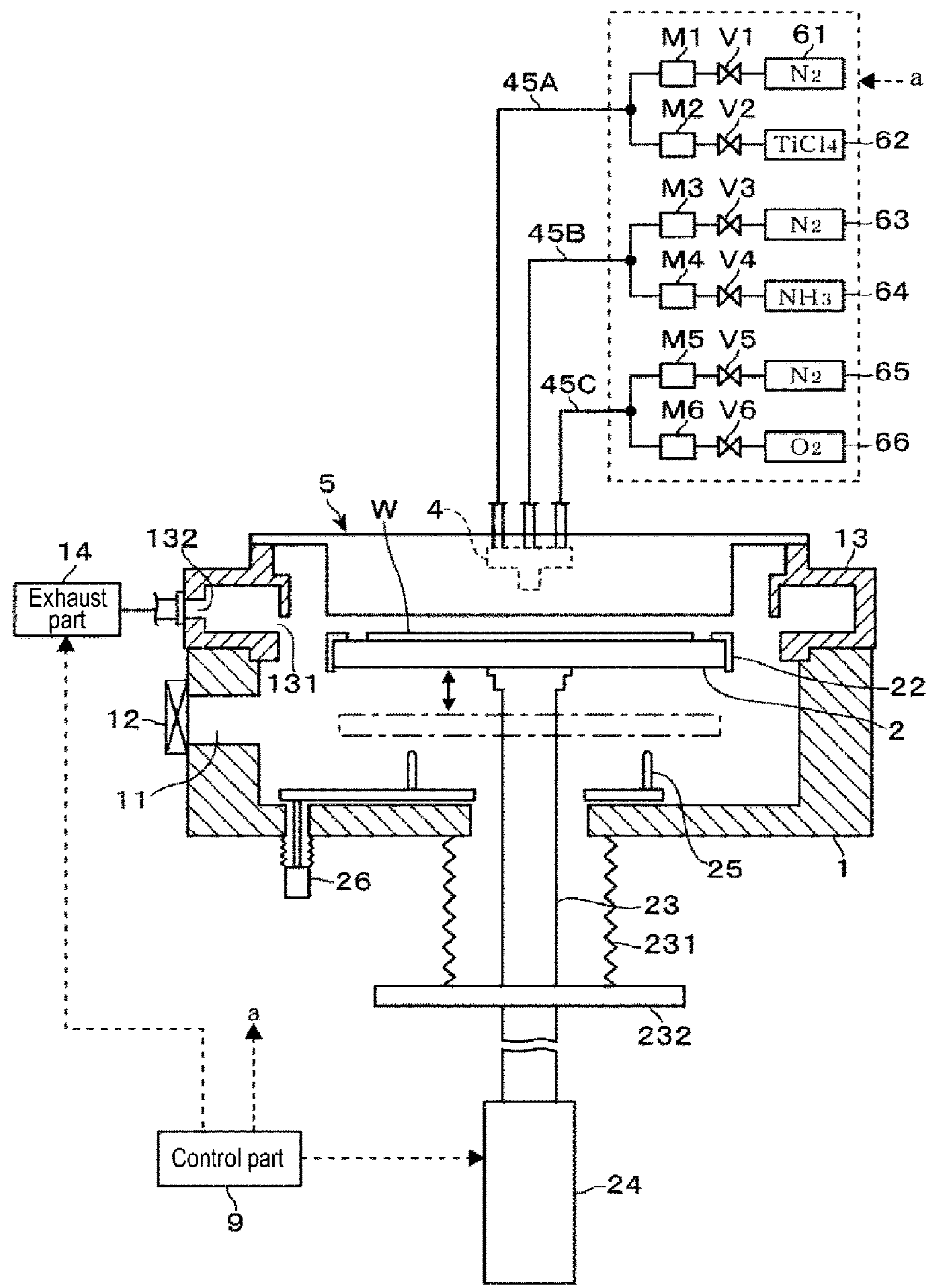
FIG. 1 is a longitudinal sectional view of a film forming apparatus according to an embodiment of the present disclosure.

As illustrated in FIG. 1, the film forming apparatus includes a processing vessel 1 which is a vacuum vessel made of a metal such as aluminum or the like and having a substantially circular planar shape, in which a mounting table 2 on which the wafer W is mounted is installed in the processing vessel 1. A loading/unloading port 11 of the wafer W and a gate valve 12 for opening and closing the loading/unloading port 11 are installed on a side surface of the processing vessel 1.

An exhaust duct 13 whose vertical cross section is formed by bending a rectangular duct in an annular shape is installed at a position above the loading/unloading port 11 so as to be stacked on a sidewall constituting a main body of the processing vessel 1. A slit-like opening 131 extending along a circumferential direction is formed on an inner peripheral surface of the exhaust duct 13. An exhaust port 132 is formed on an outer wall surface of the exhaust duct 13, and an exhaust part 14 formed of a vacuum pump or the like is connected to the exhaust port 132.

In the processing vessel 1, the mounting table 2 is installed at a position inside the exhaust duct 13. A heater (not shown) for heating the wafer W to a film formation temperature of, for example, 350 to 550 degrees C., is embedded in the mounting table 2. A cover member 22 is installed in the mounting table 2 to cover a peripheral portion of the mounting table 2 and a side peripheral surface of the mounting table 2 in a circumferential direction. A support member 23, which penetrates a bottom surface of the processing vessel 1 and extends in a vertical direction, is connected to a central part of a lower surface of the mounting table 2. A lower end portion of the support member 23 is connected to an elevator mechanism 24 via a plate-like support 232 horizontally disposed on a lower side of the processing vessel 1. The elevator mechanism 24 moves the mounting table 2 up and down between a transfer position (indicated by an alternate long and short dash line in FIG. 1) for transferring the wafer W to and from a wafer transfer mechanism (not shown) entered from the loading/unloading port 11 and a processing position indicated by the solid line in FIG. 1, which is above the transfer position and where the film formation is performed on the wafer W. A bellows 231 is installed between the bottom surface of the processing vessel 1 through which the support member 23 passes and the support 232 so as to cover the support member 23 from the outside in a circumferential direction. The bellows 231 partitions an internal atmosphere of the processing vessel 1 from the outside, and expands and contracts according to an elevation operation of the support 232.

A plurality of (e.g., three) support pins 25 is installed below the mounting table 2 to support and lift up the wafer W from a lower surface side of the wafer W when transferring the wafer W to and from the external wafer transfer mechanism. The support pins 25 are connected to an elevator mechanism 26 so that they can freely move up and down, and the wafer W is transferred to and from the wafer transfer mechanism by protruding and retracting the support pins 25 from an upper surface of the mounting table 2 via a through hole (not shown) penetrating the mounting table 2 in a vertical direction.

Figure 2:
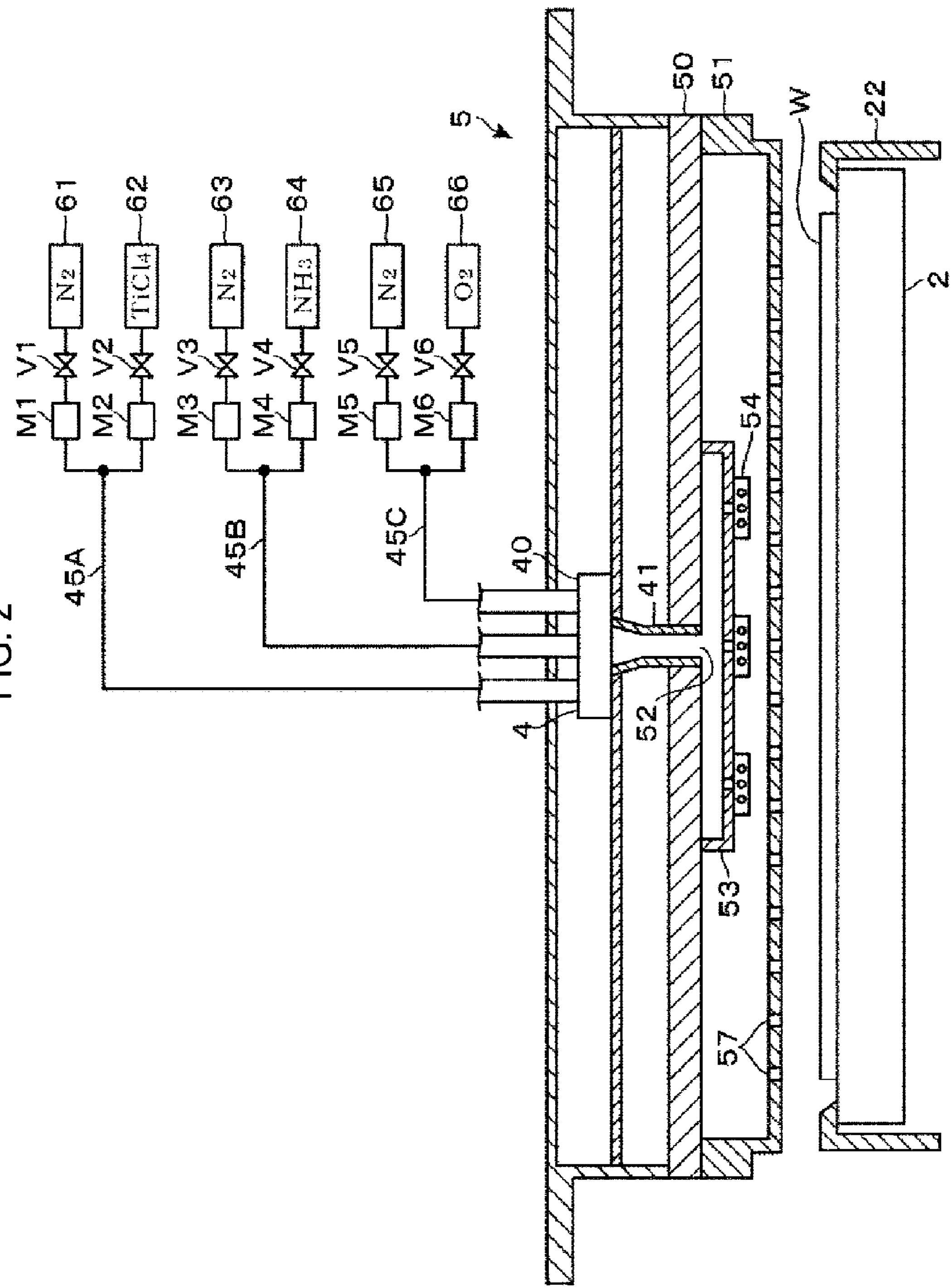
FIG. 2 is a cross sectional view of a gas mixing device according to an embodiment of the present disclosure

A gas supply part 5 for supplying a gas toward the wafer W mounted on the mounting table 2 is installed so as to close a circular opening formed on an upper surface side of the exhaust duct 13. The gas supply part 5 will be described with reference to FIG. 2. The gas supply part 5 has a top plate portion 50, and a cylindrical shower head 51 whose upper side is opened and which has a flat bottom is installed below the top plate portion 50. A gas mixing device 4 to be described later is installed within the gas supply part 5, and it is configured so that a gas mixed in the gas mixing device 4 is supplied into the shower head 51 from an opening 52 formed at the center of a lower surface of the top plate portion 50 via a gas outflow passage 41.

Figure 3:
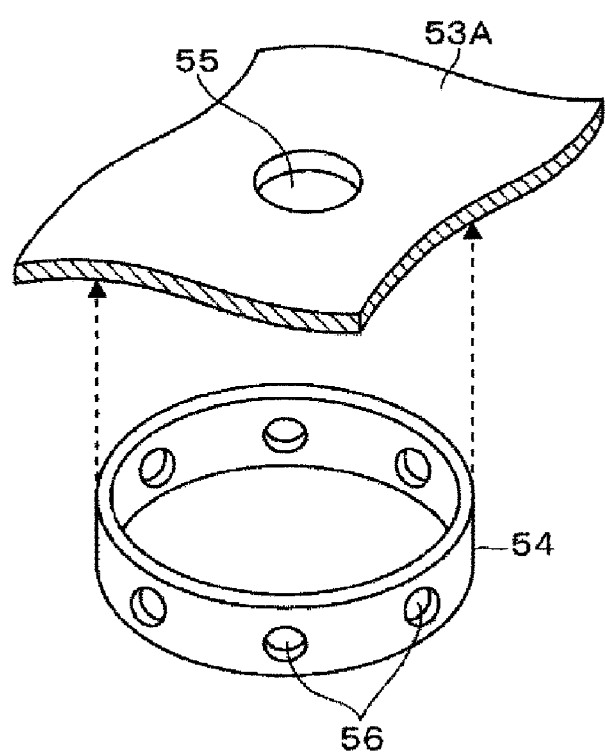
FIG. 3 is an exploded perspective view of a gas diffusion part.

A flat cylindrical diffusion chamber 53 for diffusing a gas supplied from the gas mixing device 4 is installed in the shower head 51 around the opening 52. A plurality of gas diffusion parts 54 is disposed under a lower surface 53A of the diffusion chamber 53 at equal intervals along a circle centered on a central part of the wafer W mounted on the mounting table 2 in plan view, and another gas diffusion part 54 is also disposed above the central part of the wafer W. As illustrated in FIG. 3, the gas diffusion part 54 is constituted by a cylindrical member and installed to protrude downward from the lower surface 53A of the diffusion chamber 53. A hole portion 55 for supplying a gas to each gas diffusion part 54 is formed on the lower surface 53A of the diffusion chamber 53. A plurality of gas ejection holes 56 is formed to be spaced apart from each other on a side surface of the gas diffusion part 54 in a circumferential direction. A gas introduced to the gas diffusion part 54 from the diffusion chamber 53 is ejected from each of the gas ejection holes 56 so as to be spread uniformly in a horizontal direction. Further, the gas ejected into the shower head 51 is supplied to the wafer W through gas injection holes 57 formed in the shower head 51.

Next, the gas mixing device 4 will be described with reference to FIGS. 4 to 6. The gas mixing device 4 has a cylindrical portion 40 including a lower member 40A and an upper member 40B for closing an upper side of the lower member 40A. The lower member 40A has a bottom surface portion 46 and an annular outer wall 47 forming a surrounding wall of the cylindrical portion 40, and a flange 46A is formed on an outer periphery of the outer wall 47. The upper member 40B has a top plate 48 for covering an upper side of the outer wall 47 which is the annular wall of the lower member 40A. A periphery of the upper member 40B is bent downward to form a wall portion 49. The upper member 40B engages with the lower member 40A from an upper side such that the outer wall 47 is brought into close contact with the top plate 48 and the flat cylindrical portion 40 is formed. In addition, the gray portions of FIGS. 4 and 6 represent portions of the lower member 40A in close contact with the top plate 48 of the upper member 40B.

Figure 4:
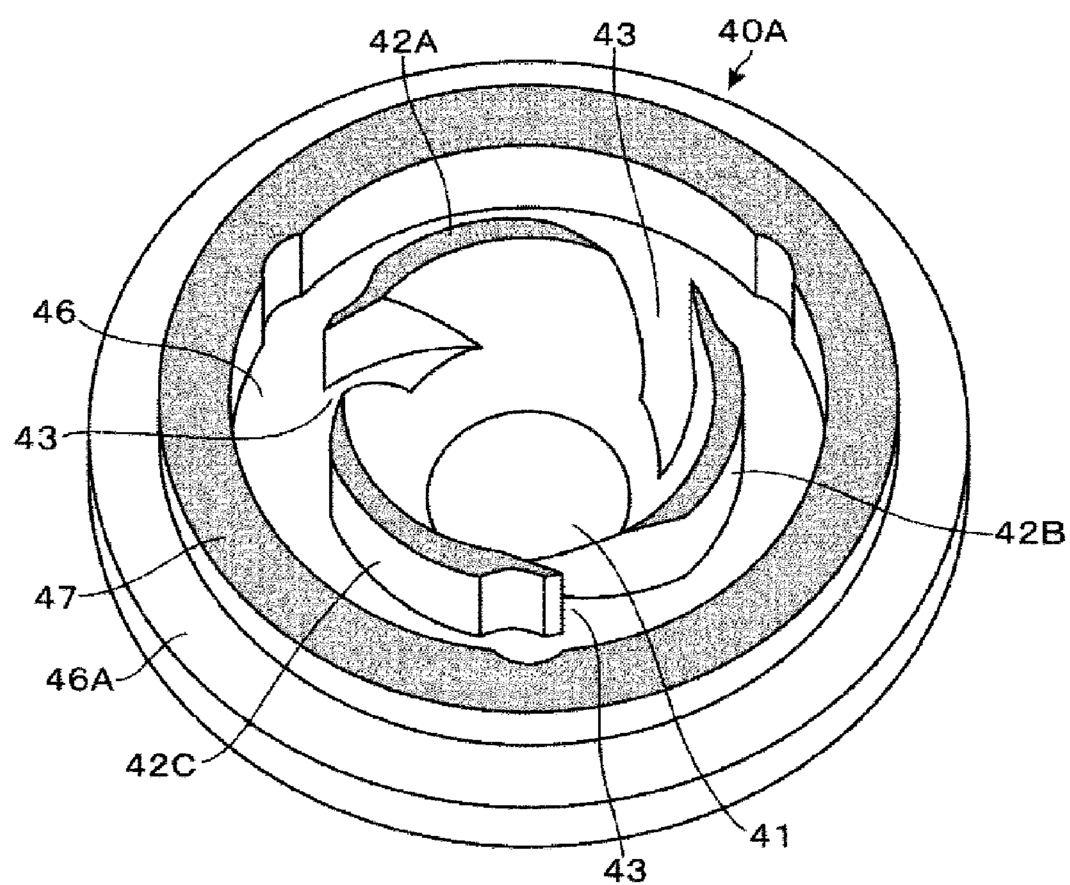
FIG. 4 is a cross sectional perspective view of the gas mixing device.
Figure 5:
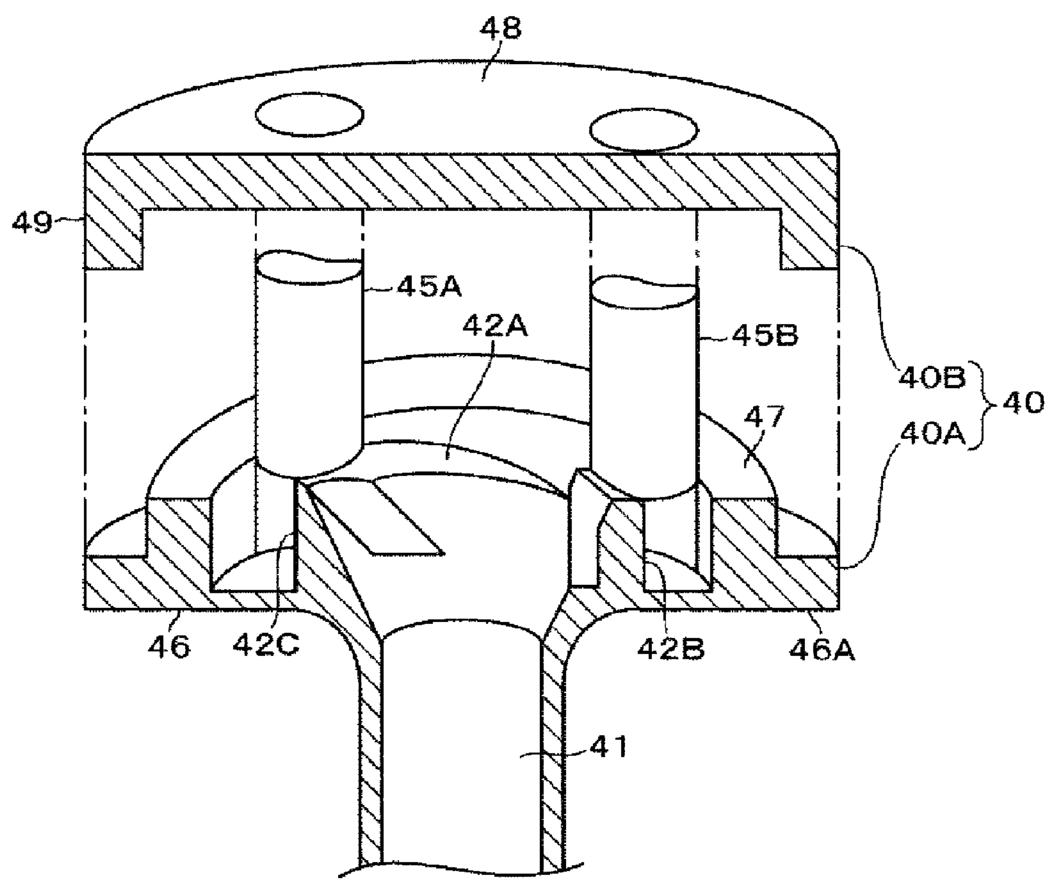
FIG. 5 is a longitudinal sectional view of the gas mixing device.
Figure 6:
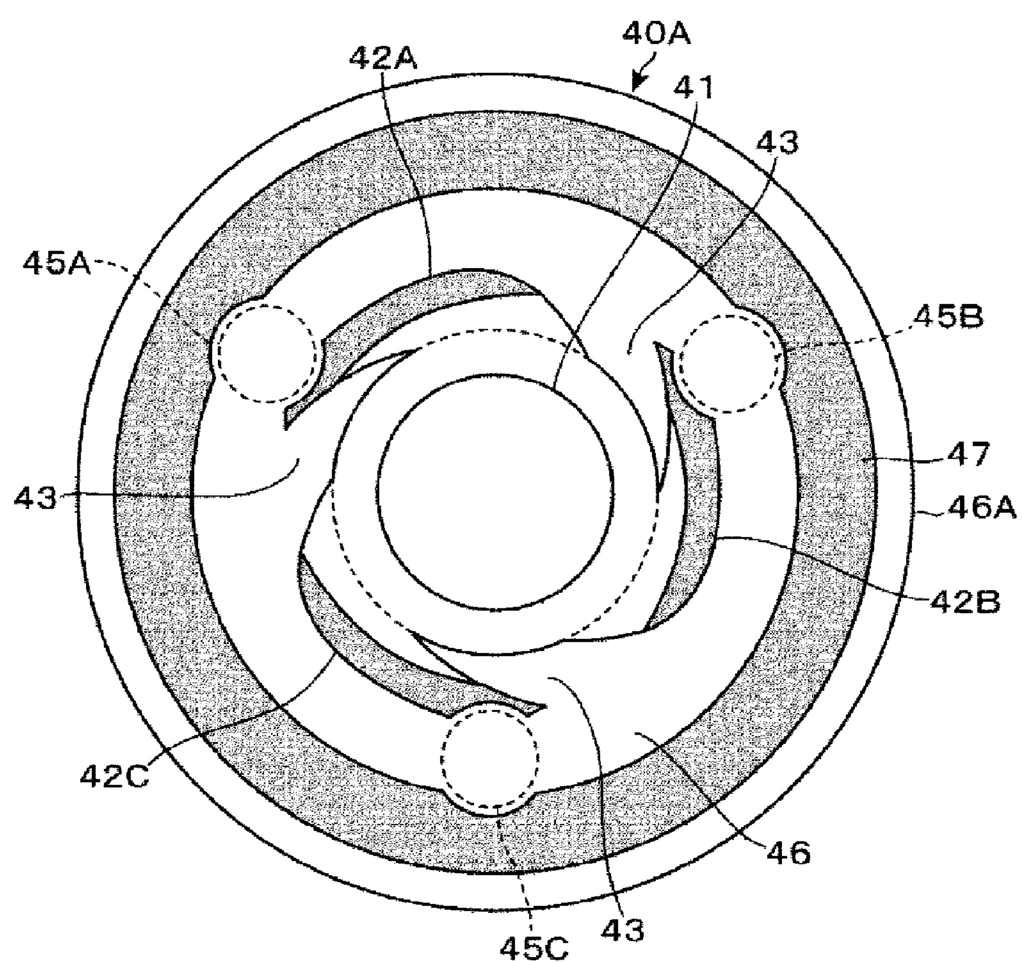
FIG. 6 is a plan view of the gas mixing device.

As illustrated in FIGS. 4 to 6, in the lower member 40A, the gas outflow passage 41 extending in a vertical direction is connected to a central portion of a lower surface of the bottom surface portion 46. The gas mixing device 4 may be constituted that the gas outflow passage 41 horizontally extends. However, in the present disclosure, the direction in which the central axis of the cylindrical portion 40 extends is a vertical direction and the gas outflow passage 41 extends in the vertical direction. Three gas stream guide walls 42A to 42C formed to extend in a circumferential direction along an edge of opening of the gas outflow passage 41 are installed in the lower member 40A. Each of the gas stream guide walls 42A to 42C is formed to be rotationally symmetrical to the center of the cylindrical portion 40. Since the three gas stream guide walls 42A to 42C have the same structure, only the gas stream guide wall 42A will be representatively described herein.

When a clockwise direction in the circumferential direction of the cylindrical portion 40 is defined as a front and a counterclockwise direction thereof is defined as a rear, the gas stream guide wall 42A protrudes from a bottom surface of the lower member 40A toward the top plate 48 of the upper member 40B. When the lower member 40A and the upper member 40B engage each other, an upper surface of the gas stream guide wall 42A is installed to be in close contact with the top plate 48 of the upper member 40B. A surface of the gas stream guide wall 42A facing the inner peripheral surface of the cylindrical portion 40, is bent toward the center of the cylindrical portion 40 in a front direction. As illustrated in FIG. 6, the gas stream guide wall 42A has an arc shape having a smaller diameter than that of the inner peripheral surface of the cylindrical portion 40 in plan view.

In addition, when the surface of the gas stream guide wall 42A facing the inner periphery of the cylindrical portion 40 is defined as an outer peripheral surface of the gas stream guide wall 42A and a surface of the gas stream guide wall 42A on the central side of the cylindrical portion 40 is defined as an inner peripheral surface of the gas stream guide wall 42A, a front end portion of the outer peripheral surface of the gas stream guide wall 42A and a rear end portion of the inner peripheral surface of the gas stream guide wall 42B installed on the front side of the gas stream guide wall 42A are disposed to face each other with a gap therebetween, and a region sandwiched between a front end portion of the outer peripheral surface of the gas stream guide wall 42A on the rear side and a rear end portion of the inner peripheral surface of the gas stream guide wall 42B on the front side becomes a gas stream guide passage 43.

Further, a front side portion of the inner peripheral surface of the gas stream guide wall 42A is an inclined surface inclined downward, and a rear side of the inner peripheral surface of the gas stream guide wall 42A is a surface standing straight. In addition, the inclined surface is a curved surface continuous with the inner peripheral surface of the gas outflow passage 41, and as illustrated in FIG. 5, the inner peripheral surface of the gas outflow passage 41 is inclined to be gradually narrow downward from the opening in the bottom surface of the cylindrical portion 40.

As illustrated in FIG. 6, one end of each of first to third gas inlet pipes 45A to 45C respectively corresponding to the gas stream guide walls 42A to 42C is connected through the top plate 48 of the upper member 40B to a rear position, relative to the center, when viewed from the front-rear side of the gas stream guide walls 42A to 42C, between each of the gas stream guide walls 42A to 42C in the cylindrical portion 40 and the inner peripheral surface of the cylindrical portion 40. The first to third gas inlet pipes 45A to 45C are disposed to be rotationally symmetrical to each other with respect to the center of the cylindrical portion 40. Further, in the lower member 40A, the inner peripheral surface of the cylindrical portion 40 and the outer peripheral surface of each of the gas stream guide walls 42A to 42*c* are bent along a contour of opening portions of the first to third gas inlet pipes 45A to 45C. The opening portions of the first to third gas inlet pipes 45A to 45C in the cylindrical portion 40 correspond to gas inlet parts.

Referring back to FIGS. 1 and 2, the other end of the first gas inlet pipe 45A is branched into two parts, and a nitrogen ($N_2$) gas supply source 61 and a titanium chloride ($TiCl_4$) gas supply source 62 are connected to the ends of the branches, respectively. The other end of the second gas inlet pipe 45B is branched into two parts, and a nitrogen ($N_2$) gas supply source 63 and an ammonia ($NH_3$) gas supply source 64 are connected to the ends of the branches, respectively. The other end of the third gas inlet pipe 45C is branched into two parts, and a nitrogen ($N_2$) gas supply source 65 and an oxygen ($O_2$) gas supply source 66 are connected to the ends of the branches, respectively. Further, in the drawing, reference symbols M1 to M6 denote flow rate adjusting parts, and reference symbols V1 to V6 denote valves. The first to third gas inlet pipes 45A to 45C are heated to, for example, 200 degrees C. by a heater (not shown). In this example, the $N_2$ gas corresponds to the carrier gas, and the $TiCl_4$ gas, the $NH_3$ gas and the $O_2$ gas correspond to the film forming gases.

As illustrated in FIG. 1, the film forming apparatus is connected with a control part 9. The control part 9 is configured with, for example, a computer having a CPU and a memory part (not shown). A program having groups of steps (commands) organized to control operations of the film forming apparatus, namely operations of moving the wafers W mounted on the mounting table 2 up to the processing position, supplying a reaction gas, an oxide gas, and a substituting gas toward the wafers W in a given order to form a TiON film, and unloading the wafers W after the film formation is stored in the memory part. This program is stored in, for example, a storage medium such as a hard disc, a compact disc, a magneto-optical disc, a memory card or the like, and installed on the computer therefrom.

Figure 7:
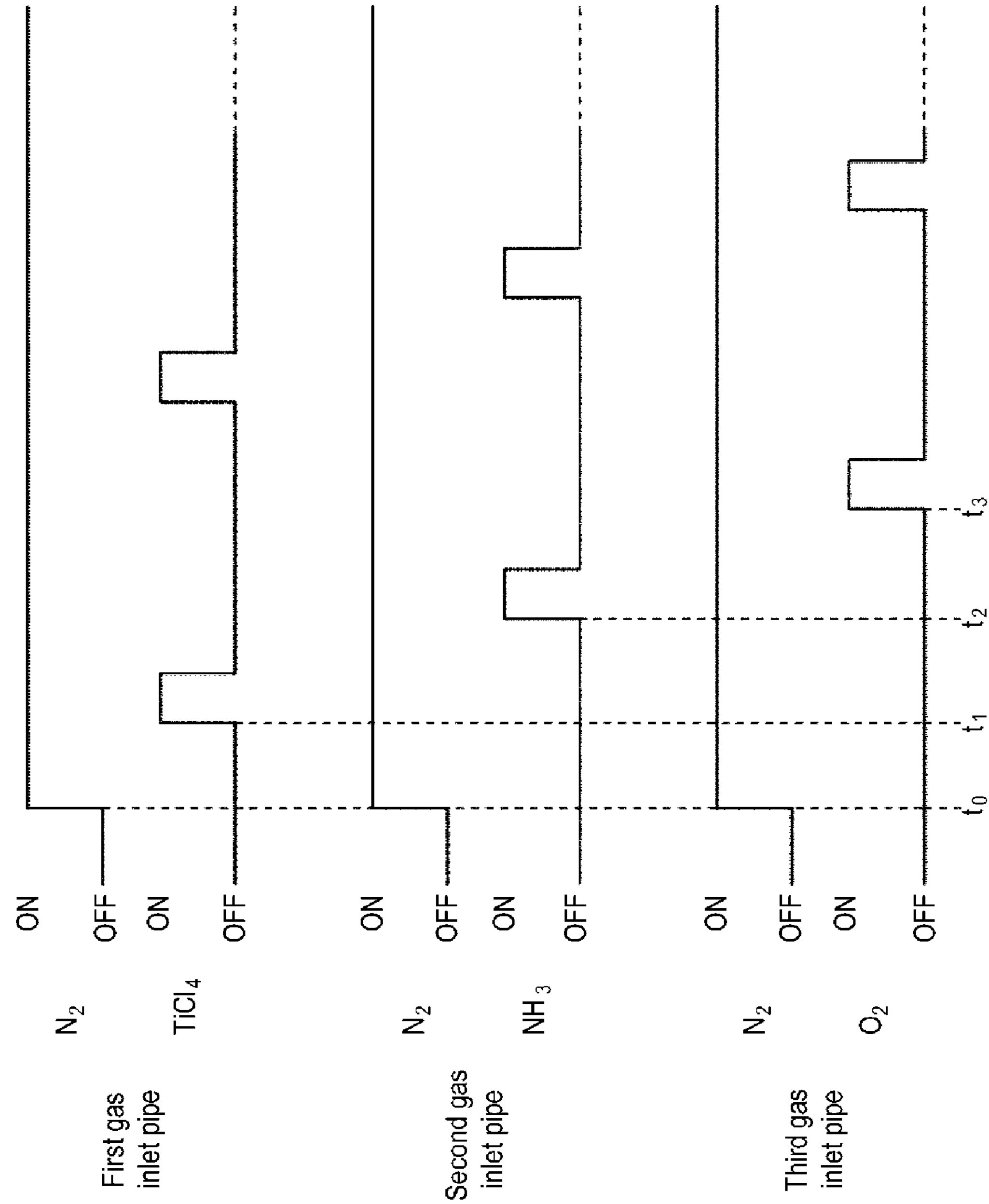
FIG. 7 is a timing chart of a gas supply in the embodiment of the present disclosure.

Next, an operation of the film forming apparatus according to an embodiment of the present disclosure will be described. FIG. 7 is a timing chart of a gas supply in the film forming process of a TiON film by an ALD method. Further, in FIG. 7, the horizontal axis does not accurately represent a time interval of supply and stop of each gas. First, the interior of the processing vessel 1 is depressurized to a predetermined vacuum atmosphere in advance and the mounting table 2 is subsequently moved down to a transfer position. Then, the gate valve 12 is opened and a transfer arm of the wafer transfer mechanism installed in, for example, a vacuum transfer chamber (not shown), connected to the loading/unloading port 11 is entered so that the wafers W are transferred to and from the support pins 25. Thereafter, the support pins 25 are moved down and the wafers W are mounted on the mounting table 2 heated by the heater to, e.g., 440 degrees C.

Next, the gate valve 12 is closed and the mounting table 2 is moved up to the processing position. Further, at time $t_0$ illustrated in FIG. 7, the valves V1, V3, and V5 of the gas mixing device 4 are opened. The flow rate or time mentioned in the description of the sequence given below is merely an example for explanation. Accordingly, an $N_2$ gas with a flow rate of 5,000 sccm is supplied from each of the first to third gas inlet pipes 45A to 45C into the cylindrical portion 40. Thus, the $N_2$ gas with a total flow rate of 15,000 sccm is supplied from the gas mixing device 4 into the processing vessel 1.

Subsequently, the internal pressure of the processing vessel 1 is regulated to a pressure predetermined in a process recipe, and the valve V2 is then opened for 0.05 seconds from time $t_1$. Accordingly, a $TiCl_4$ gas with a flow rate of, for example, 50 sccm, is supplied together with the $N_2$ gas from the first gas inlet pipe 45A into the cylindrical portion 40. Then, the mixture of the $TiCl_4$ gas and the $N_2$ gas introduced from the first gas inlet pipe 45A is mixed with the $N_2$ gas introduced from each of the second gas inlet pipe 45B and the third gas inlet pipe 45C in the cylindrical portion 40, and is supplied into the processing vessel 1 via the gas outflow passage 41.

Further, by closing the valve V2 after the lapse of 0.05 seconds from the time $t_1$, only the $N_2$ gas is introduced from the first gas inlet pipe 45A to the cylindrical portion 40. Thus, only the $N_2$ gas is supplied from the gas mixing device 4 into the processing vessel 1. Accordingly, the $TiCl_4$ gas in the processing vessel 1 is substituted by the $N_2$ gas. Subsequently, the valve V4 is opened for 0.2 seconds from time $t_2$ after the lapse of 0.2 seconds from when the valve V2 is closed. Thus, the $NH_3$ gas with a flow rate of 2,700 sccm is supplied together with the $N_2$ gas from the second gas inlet pipe 45B to the cylindrical portion 40. Then, the gas supplied from the second gas inlet pipe 45B is mixed with the $N_2$ gas introduced from each of the first gas inlet pipe 45A and the third gas inlet pipe 45C in the cylindrical portion 40, and is supplied to the processing vessel 1.

Further, by closing the valve V4, only the $N_2$ gas is introduced from the second gas inlet pipe 45B, and the $N_2$ gas is supplied from the gas mixing device 4 to the processing vessel 1 and the $NH_3$ gas in the processing vessel 1 is substituted by the $N_2$ gas. In addition, the valve V6 is opened for 0.2 seconds from time $t_3$ after the lapse of 3.3 seconds from when the valve V4 is closed. Thus, the $O_2$ gas with a flow rate of 50 sccm is supplied together with the $N_2$ gas from the third gas inlet pipe 45C to the cylindrical portion 40, mixed with the $N_2$ gas introduced from each of the first gas inlet pipe 45A and the second gas inlet pipe 45B in the cylindrical portion 40, and supplied to the processing vessel 1. Further, by closing the valve V6, only the $N_2$ gas is introduced from the third gas inlet pipe 45C, and the $N_2$ gas is supplied from the gas mixing device 4 into the processing vessel 1 and the $O_2$ gas in the processing vessel 1 is substituted by the $N_2$ gas.

In this manner, the reaction gases ($TiCl_4$ gas and $NH_3$ gas), the oxide gas ($O_2$ gas), and the substituting gas ($N_2$ gas) are supplied in the order of the $TiCl_4$ gas, the $N_2$ gas, the $NH_3$ gas, the $N_2$ gas, the $O_2$ gas and the $N_2$ gas. By supplying the $TiCl_4$ gas and the $NH_3$ gas to the wafer W, a molecular layer of titanium nitride (TiN) is laminated on the surface of the wafer W, and by supplying the $O_2$ gas, the molecular layer of titanium nitride (TiN) is oxidized and becomes a molecular layer of TiON. By repeating this process, TiON is laminated and a TiON film is formed.

The gases introduced from the first to third gas inlet pipes 45A to 45C are mixed in the gas mixing device 4 and supplied to the processing vessel 1. However, as described in the background section, when a gas with a low flow rate such as the $O_2$ or the like gas as described in the aforementioned embodiment is mixed with an $N_2$ gas with a large flow rate, it is difficult to uniformly mix them. Here, the mixing of gases in the gas mixing device 4 according to the aforementioned embodiment will be described by an example in which the $O_2$ gas is supplied from the time $t_3$.

Figure 8:
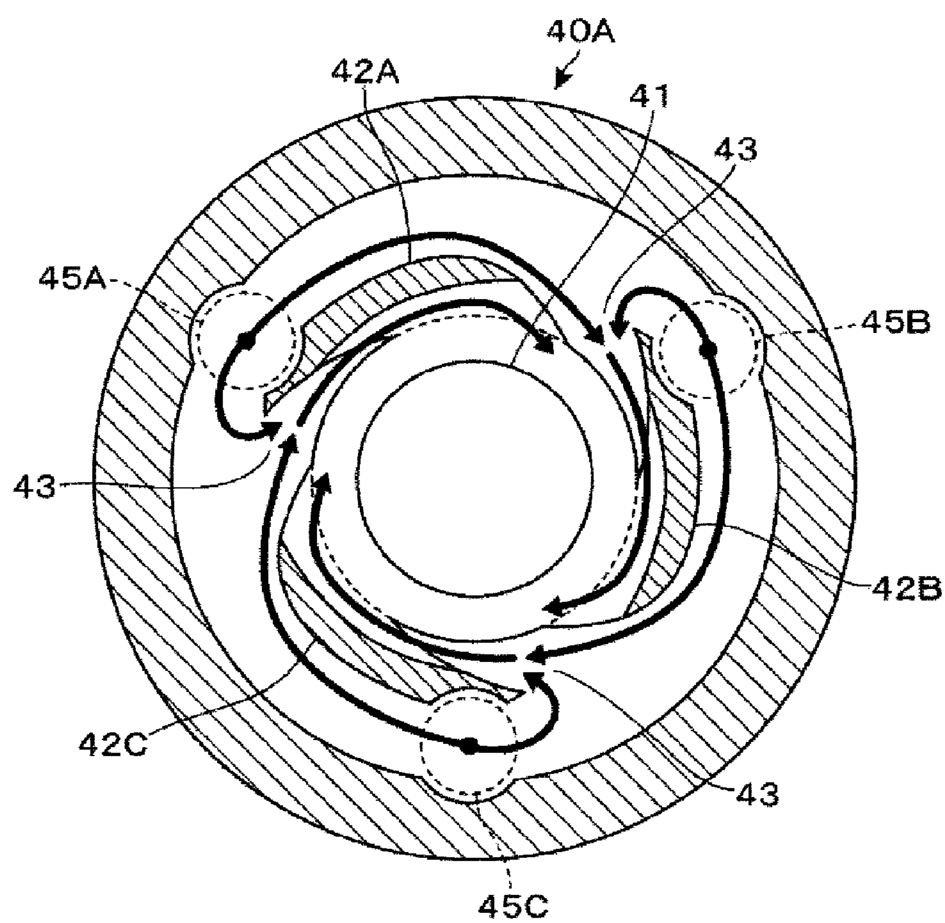
FIG. 8 is an explanatory view illustrating a flow of gas in the gas mixing device.

As illustrated in FIG. 8, a gas supplied from the third gas inlet pipe 45C into the cylindrical portion 40 is regulated by the gas stream guide wall 42C, and thus flows in a circumferential direction (the front-rear direction) of the cylindrical portion 40. A front side of the gas stream guide wall 42C is bent toward the central side of the cylindrical portion 40. A front end side of the outer peripheral surface of the gas stream guide wall 42C is disposed to face a rear end side of the inner peripheral surface of the gas stream guide wall 42A positioned in front of the gas stream guide wall 42C. The gas stream guide passage 43 for guiding a gas is provided between a front end side of the outer peripheral surface of the gas stream guide wall 42C and a rear end side of the inner peripheral surface of the gas stream guide wall 42A. Further, the gas stream guide wall 42C has an arc shape having a smaller diameter than that of the inner peripheral surface of the cylindrical portion 40. Thus, a gas, which is introduced to the cylindrical portion 40 from the third gas inlet pipe 45C and flows to a front side along the outer peripheral surface of the gas stream guide wall 42C, flows while being bent toward the center of the cylindrical portion 40 and enters the inner peripheral surface side of the preceding gas stream guide wall 42A followed by the gas stream guide wall 42C from the gas stream guide passage 43.

The gas that has entered the inner peripheral surface side of the gas stream guide wall 42A flows along the inner peripheral surface of the gas stream guide wall 42A. Since the front side of the inner peripheral surface of the gas stream guide wall 42A has a curved surface continuous with the inner surface of the gas outflow passage 41, the gas introduced to the inner surface side of the gas stream guide wall 42A enter the gas outflow passage 41 while being bent along the curvature of the inner peripheral surface of the gas stream guide wall 42A. At this time, since the gas flows along the periphery of the gas outflow passage 41 in the circumferential direction and enters the gas outflow passage 41 while flowing along the outer peripheral surface of the gas stream guide wall 42C and the inner peripheral surface of the gas stream guide wall 42A, the gas becomes a swirl flow flowing along the inner peripheral surface of the gas outflow passage 41 in the circumferential direction, as illustrated in FIG. 8.

Further, a portion of the gas supplied from the third gas inlet pipe 45C to the cylindrical portion 40 flows toward the rear side along the outer peripheral surface of the gas stream guide wall 42C and then flows toward the inner peripheral surface side of the gas stream guide wall 42C together with a gas, which is supplied from the second gas inlet pipe 45B and flows toward the front side along the gas stream guide wall 42B provided right behind the gas stream guide wall 42C, to become a swirl flow flowing along the inner peripheral surface of the gas outflow passage 41 in the circumferential direction.

Figure 9:
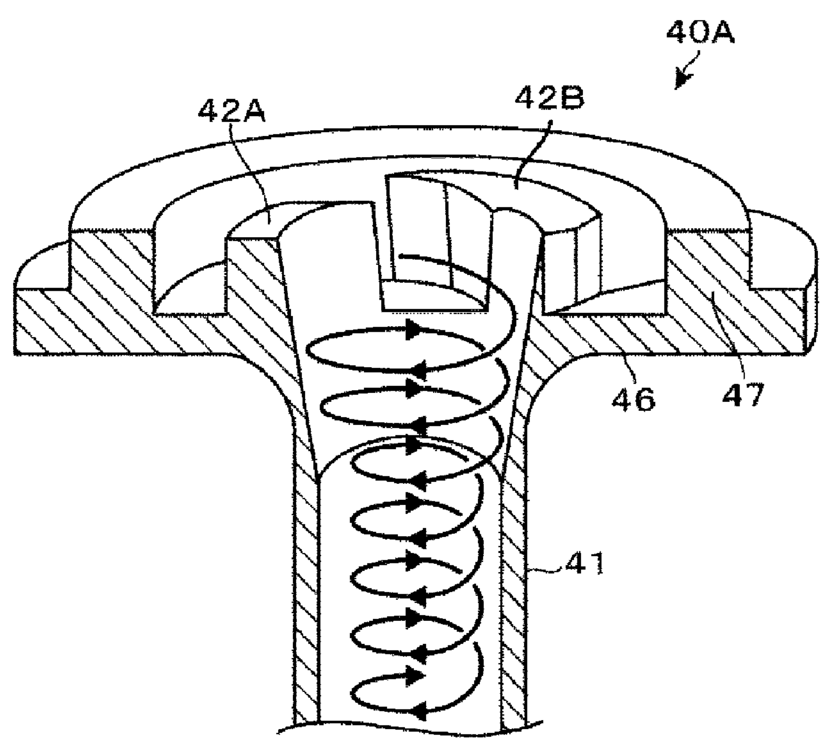
FIG. 9 is an explanatory view illustrating a flow of gas in the gas mixing device.

In addition, a space surrounded by the inner surfaces of the gas stream guide walls 42A to 42C and the inner peripheral surface of the gas outflow passage 41 is configured to become narrow downward. Thus, as illustrated in FIG. 9, as the swirl flow flowing along the inner surfaces of the gas stream guide walls 42A to 42C and flowing along the inner peripheral surface of the gas outflow passage 41 goes to a lower side of the gas outflow passage 41, its rotation radius is gradually reduced to cause flow velocity to be increased.

Then, similar to the gas supplied from the third gas inlet pipe 45C to the cylindrical portion 40, the $N_2$ gas supplied from the first gas inlet pipe 45A and the second gas inlet pipe 45B to the cylindrical portion 40 also becomes a swirl flow and flows along the gas outflow passage 41, while gradually increasing the its flow velocity.

Each of the gases supplied from the first to third gas inlet pipes 45A to 45C becomes a swirl flow and flows along the gas outflow passage 41 while gradually increasing the its flow velocity. As illustrated in the examples described hereinbelow, when the film forming gas having a small flow rate is mixed with the $N_2$ gas having a large flow rate, they are uniformly mixed, as well as the mixing between the $TiCl_4$ gas and the $N_2$ gas and between the $NH_3$ gas and the $N_2$ gas. Thus, the gas containing a small amount of $O_2$ supplied from the third gas inlet pipe 45C and the $N_2$ gas supplied from the first gas inlet pipe 45A and the second gas inlet pipe 45B are mixed with each other and become a mixture gas at a uniform concentration. The mixture gas is supplied to the processing vessel 1. Then, the mixture gas is diffused in the gas diffusion part 54 and supplied to the wafer W via the shower head 51.

In this manner, after a TiON film having a predetermined film thickness is formed by repeating the supply of the $TiCl_4$ gas, the supply of the $NH_3$ gas, and the supply of the $O_2$ gas, for example, tens of times to hundreds of times, a final $O_2$ gas is discharged by supplying a substituting nitrogen gas, and the mounting table 2 is moved down to the transfer position. Then, the gate valve 12 is opened to allow the transfer arm to enter, and the wafer W is transferred to the transfer arm from the support pins 25 in a reverse order from the loading process.

In the aforementioned embodiment, in mixing the small flow rate of the $O_2$ gas with the large flow rate of the $N_2$ gas, in the cylindrical portion 40 in which the gas outflow passage 41 is installed at the central portion of the bottom surface thereof and the upper surface thereof is closed, the gas stream guide walls 42A to 42C, which have the end portions of the front side bent toward the center of the cylindrical portion 40 and are rotationally symmetrical to the center of the cylindrical portion 40, are disposed to be spaced apart from each other along the edge of the opening of the gas outflow passage 41. Thus, the gases introduced from the first to third gas inlet pipes 45A to 45C installed between the gas stream guide walls 42A to 42C and the inner peripheral surface of the cylindrical portion 40 flow along the outer peripheral surfaces of the gas stream guide walls 42A to 42C and become the swirl flows, which are then guided to the gas outflow passage 41. Since the gases introduced from the first to third gas inlet pipes 45A to 45C becomes the swirl flows, when the gas streams join in the gas outflow passage 41, non-uniformity of concentration of the mixture gas is difficult to occur, thus the gases can be uniformly mixed.

Further, as illustrated in the examples described hereinbelow, for example, even when a mixture ratio between the film forming gas and the carrier gas (a mass flow rate of the film forming gas/mass flow rate of the carrier gas) is large, the gases can be sufficiently mixed. Thus, when the $TiCl_4$ gas is supplied from the first gas inlet pipe 45 A and the $N_2$ gas is supplied from the second and third gas inlet pipes 45B and 45C, or when the $NH_3$ gas is supplied from the second gas inlet pipe 45B and the $N_2$ gas is supplied from the first and third gas inlet pipes 45A and 45C, the gases are uniformly mixed.

In addition, as the mixture ratio between the film forming gas and the carrier gas is reduced, the gases are difficult to be mixed. Thus, when the gases having a mixture ratio of 0.4 or less between the film forming gas and the carrier gas are mixed, a greater effect may be achieved. The mixture ratio is a value of (mass flow rate of film forming gas/mass flow rate of the carrier gas) in a gas supplied from one gas inlet pipe to the cylindrical portion 40, and the same mass flow rate of the carrier gas introduced from the other gas inlet pipe as that of the carrier gas introduced from one gas inlet pipe is introduced to the cylindrical portion 40.

In addition, when only a small flow rate of the film forming gas is introduced from one gas inlet pipe and a large flow rate of the carrier gas is introduced from the other gas inlet pipe, the same effects may be achieved as well.

As illustrated in the examples described hereinbelow, when installing the first to third gas inlet pipes 45A to 45C between the gas stream guide walls 42A to 42C and the inner peripheral surface of the cylindrical portion 40, since the first to third gas inlet pipes 45A to 45C are installed on a rear side, relative to the each center of the gas stream guide walls 42A to 42C, the mixture gas is more uniformly mixed. It is supposed that this is because a portion of each of the gases introduced to the cylindrical portion 40 from the first to third gas inlet pipes 45A to 45C flows toward the rear side of the gas stream guide walls 42A to 42C, respectively, and joins each of the gases flowing along the outer peripheral surfaces of the gas stream guide walls 42C, 42A and 42B provided right behind the gas stream guide walls 42A to 42C, thus being easily mixed.

The inner peripheral surfaces of the gas stream guide walls 42A to 42C include the inclined surface formed to be inclined downward. The gas outflow passage 41 includes an inclined surface formed to be inclined toward the center of the cylindrical portion 40 from the opening in the bottom surface of the cylindrical portion 40 in a downward direction. With this configuration, it is possible to gradually increase the speed of the swirling flow. Thus, the mixture gas can be more uniformly mixed as illustrated in the examples described hereinbelow.

Among the adjacent gas stream guide walls 42A to 42C, a rear end portion of the inner peripheral surface of the gas stream guide wall on the front side, for example, the gas stream guide wall 42A, and a front end portion of the outer peripheral surface of the gas stream guide wall 42C on the rear side are disposed to face each other. The gas stream guide passage 43 is provided between the rear end portion of the inner peripheral surface of the gas stream guide wall 42A and the front end portion of the outer peripheral surface of the gas stream guide wall 42C. Thus, since a gas flowing along the outer peripheral surface of the gas stream guide wall 42C on the rear side can be more reliably guided to the inner peripheral surface side of the gas stream guide wall 42A on the front side, it is possible to more reliably form the swirl flow.

As described above, since the speed of the swirl flow can be increased by allowing the inner peripheral surfaces of the gas stream guide walls 42A to 42C to be inclined, the mixture gas can be more uniformly mixed. However, if even the rear end portion side of the inner peripheral surface of the gas stream guide wall 42A is inclined, the rear end portion of the inner peripheral surface of the gas stream guide wall 42A and the front end portion of the outer peripheral surface of the gas stream guide wall 42C are too close. Therefore, it is difficult to guide a gas toward the inner peripheral surface side of the gas stream guide wall 42A on the front side. For these reasons, the rear side of the inner peripheral surface of the gas stream guide wall 42A is formed as a surface standing more straight than the front side, whereby the gas can easily enter the gas stream guide passage 43.

A gas of one gas inlet pipe among the three gas inlet pipes 45A to 45C is stopped and gases may be supplied from the other two gas inlet pipes so as to be mixed. For example, the supply of a gas of the first gas inlet pipe 45A is stopped and an $N_2$ gas is supplied from the second gas inlet pipe 45B and an $N_2$ gas and an $O_2$ gas are supplied from the third gas inlet pipe 45C. Also in this case, since the gases supplied from the second gas inlet pipe 45B and the third gas inlet pipe 45C are mixed as swirl flows, they are uniformly mixed.

The gas mixing device 4 may be applied to a plasma processing apparatus. For example, the film forming apparatus illustrated in FIGS. 1 and 2 may be configured so that a high-frequency power may be applied to the shower head 51, and the mounting table 2 is connected to a ground potential. Further, it may be configured so that capacitively coupled plasma is generated between the shower head 51 as an upper electrode and the mounting table 2 as a lower electrode, and a gas mixed by the gas mixing device 4 is supplied between the shower head 51 and the mounting table 2. In addition, a process gas mixed by the gas mixing device 4 may be a raw material gas and a reaction gas reacting with the raw material gas, or it may be applied to a CVD device in which a mixture of the raw material gas and the reaction gas is supplied to the wafer W.

The first to third gas inlet pipes 45A to 45C may be connected to a side surface of the cylindrical portion 40. Even when a gas is supplied from the side surface of the cylindrical portion 40, since a gas stream is guided by the gas stream guide walls 42A to 42C, the same effects may be achieved.

In addition, when the number of gas inlet pipes and gas stream guide walls is increased, it is necessary to enlarge the cylindrical portion 40, making it difficult to mix gases. For these reasons, it is preferable that the number of gas inlet pipes and gas stream guide walls is two or three. Further, the inner peripheral surfaces of the gas stream guide walls 42A to 42C may be vertical surfaces instead of inclined surfaces.

EXAMPLES

In order to verify the effects of the present disclosure, a film forming apparatus employing the gas mixing device 4 was used and a mixture gas was supplied into the processing vessel 1, and the uniformity of the upper side of the mounting table 2 was examined by simulation.

Example 1

A mass flow ratio (mass flow rate of the reaction gas/mass flow rate of the carrier gas) between a reaction gas and a carrier gas supplied from the first gas inlet pipe 45A was set at 0.338 by using the film forming apparatus employing the gas mixing device 4 according to the embodiment of the present disclosure. The same amount of carrier gas as that of the carrier gas supplied from the first gas inlet pipe 45A was flowed to the other second gas inlet pipe 45B and the third gas inlet pipe 45C, respectively. In addition, the internal pressure of the processing vessel 1 was set at 3 Torr (400 Pa) and the temperature of the gas was set at 200 degrees C.

Example 2

Figure 10A:
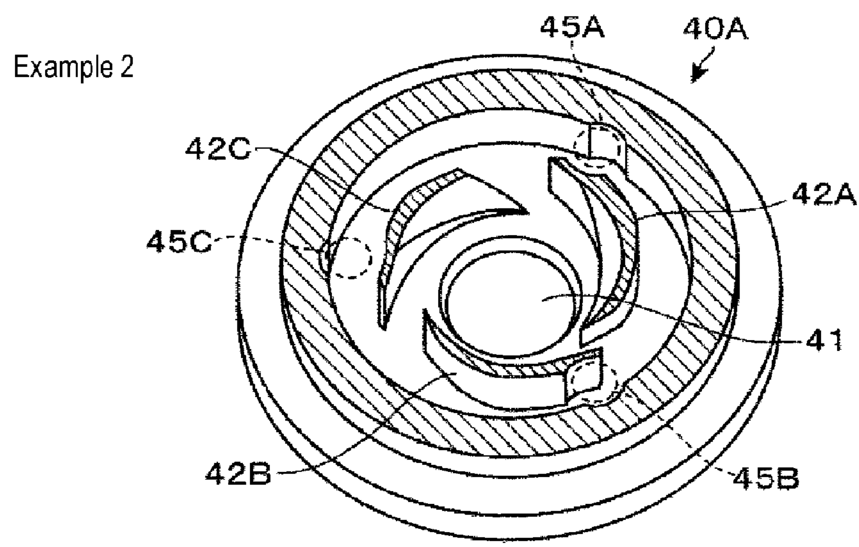
FIGS. 10A to 10C are cross sectional perspective views illustrating gas mixing devices according to a comparative example and examples.

As illustrated in FIG. 10A, an example in which the gas mixing device 4 having the same configuration as that of example 1 is applied, except that the inner peripheral surface of the gas outflow passage 41 was a vertical surface, was illustrated as example 2.

Example 3

Figure 10B:
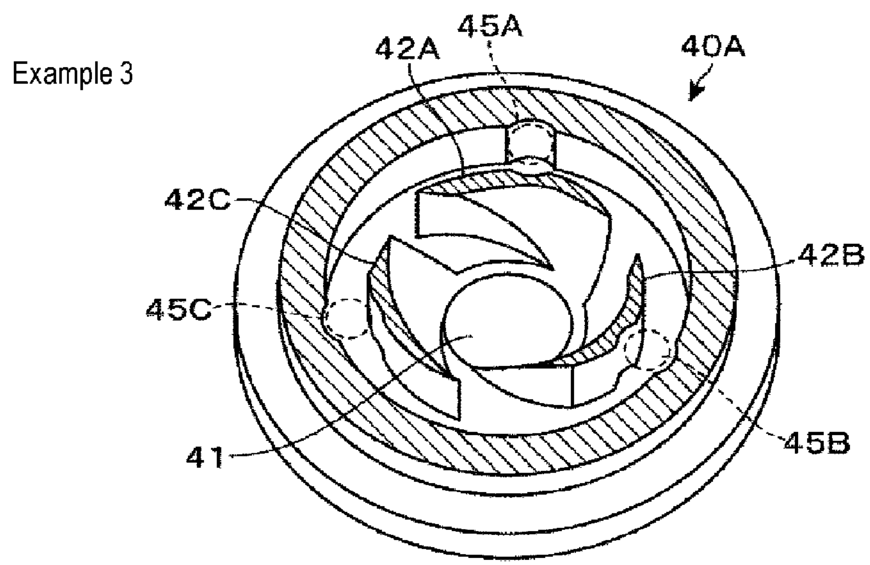

As illustrated in FIG. 10B, an example in which the gas mixing device 4 having the same configuration as that of example 2 is applied, except that a connection position of the first to third gas inlet pipes 45A to 45C to which the respective gases in the cylindrical portion 40 are introduced was set at a position corresponding to the each center of the gas stream guide walls 42A to 42C in the front-rear direction, was illustrated as example 3.

Comparative Example

Figure 10C:
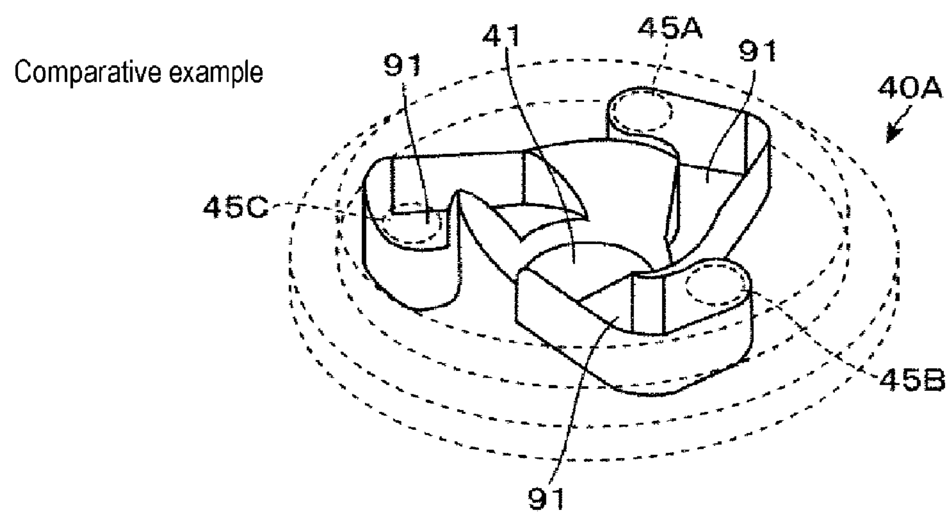

As illustrated in FIG. 10C, an example in which a gas mixing device employing a flow passage, instead of the cylindrical portion 40 illustrated in example 1, was illustrated as a comparative example. The flow passage 91 allows gases supplied from the first to third gas inlet pipes 45A to 45C to flow to one side in a circumferential direction when viewed from the gas outflow passage 41. Subsequently, the gases are bent to be perpendicular to the gas outflow passage side, and discharged from the gas outflow passage 41. Further, in FIG. 10C, in order to avoid cumbersomeness of description, only a portion through which a gas flows is indicated by the solid line and an outer wall and a bottom surface portion in the lower member 40A are indicated by the dotted lines.

Figure 11:
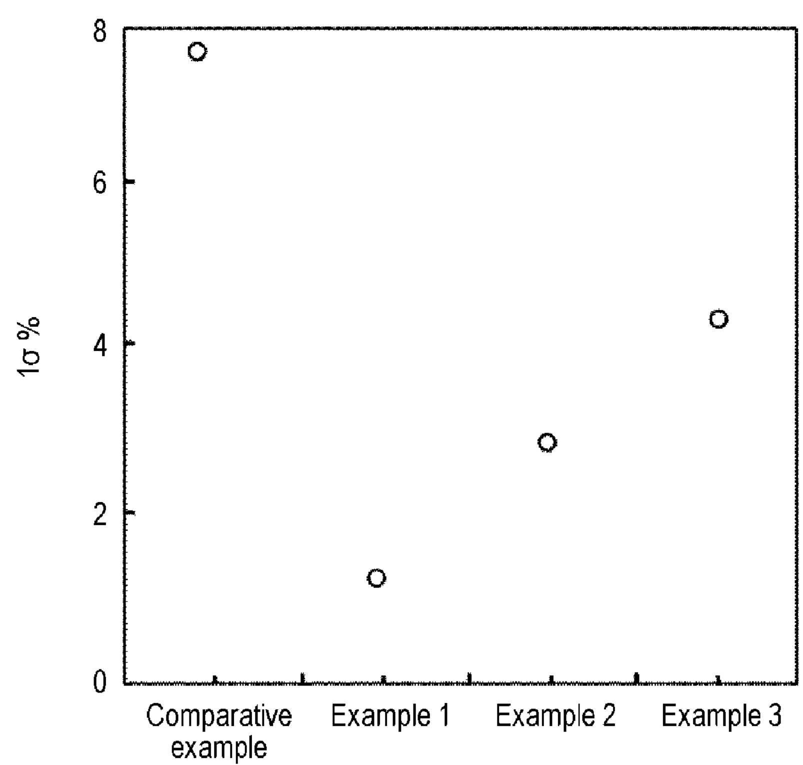
FIG. 11 is a characteristic view illustrating standard deviations of masses of gases in the comparative example and examples.

Masses of gases were measured at eight points at equal intervals in a circumferential direction above a peripheral portion of the mounting table 2 when gases were supplied in each of examples 1 to 3 and the comparative example, and standard deviation ($1\sigma$) of the masses of the gases at the eight points were obtained. FIG. 11 is a characteristic view illustrating the results and illustrating standard deviations ($1\sigma$) in examples 1 to 3 and the comparative example as a percentage ($1\sigma$ %) to an average value. Further, the comparative example and examples 2 and 3 employ a structure in which a recess is formed in the diffusion chamber 53, but it does not affect an evaluation of the effects of the gas mixing device 4.

As illustrated in FIG. 11, $1\sigma$ % in the comparative example and examples 1 to 3 were 7.8%, 1.08%, 2.9%, and 4.2%, respectively. According to the results, compared with the gas mixing device 4 according to the comparative example, the gas mixing devices 4 according to examples 1 to 3 have a reduced $1\sigma$ %, and thus, it can be seen that gases are more uniformly mixed above the mounting table 2.

Example 2 has a smaller $1\sigma$ % than that of example 3. Thus, it can be said that gases are more uniformly mixed by allowing a connection position of the first to third gas inlet pipes 45A to 45C for supplying the respective gases in the cylindrical portion 40 to be set on a rear side, relative to the central part of the gas stream guide walls 42A to 42C in the front-rear direction.

Example 1 has a smaller 1σ % than that of example 2. Thus, it can be said that gases are more uniformly mixed by configuring the inner peripheral surface of the gas outflow passage 41 to be gradually narrow downward.

Further, mass flow ratios between a reaction gas and a carrier gas were set at 0.338, 0.342, 0.363, 0.830, 0.840, and 0.96 using the film forming apparatus employing the gas mixing device 4 illustrated in example 1, and a standard deviation (1σ) of the mass of the gas was obtained as in example 1.

Figure 12:
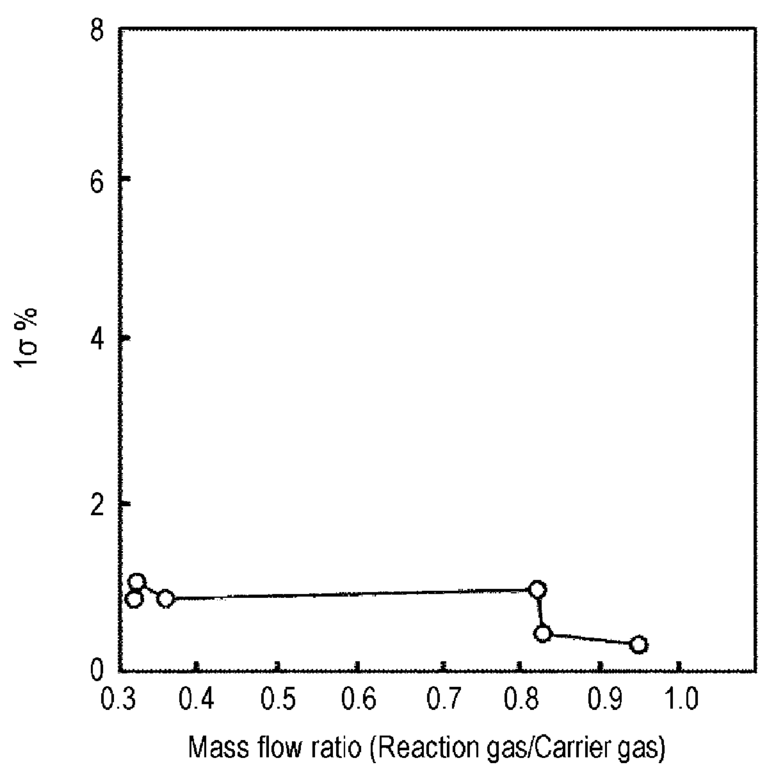
FIG. 12 is a characteristic view illustrating a standard deviation regarding a mass flow ratio between the reaction gas and the carrier gas.

FIG. 12 is a characteristic view illustrating the results and illustrating the standard deviations (1σ) regarding a mass flow ratio between the reaction gas and the carrier gas. As illustrated in FIG. 12, 1σ % was 1.08 or less, which is very low, in any cases where the mass flow ratio was 0.338 to 0.96. According to the results, it can be said that gases are uniformly mixed above the mounting table 2, regardless of a mass flow ratio, by using the gas mixing device 4 according to the embodiment of the present disclosure.

According to the present disclosure in some embodiments, in mixing plural kinds of gases, in a cylindrical portion in which a gas outflow passage is opened in a central portion of a bottom surface thereof, a plurality of gas stream guide walls, which are bent toward the center of the cylindrical portion in a circumferential direction and rotationally symmetrical to the center of the cylindrical portion, is disposed to be spaced apart from each other in the circumferential direction along an edge of an opening of the gas outflow passage. Thus, gases introduced between the gas stream guide walls and an inner peripheral surface of the cylindrical portion flow along outer peripheral surfaces of the gas stream guide walls to become the swirl flows, which are guided to the gas outflow passage. Accordingly, since the gases become the swirl flows and join in the gas outflow passage, non-uniformity of concentration of a mixture gas is difficult to occur, and it is possible to uniformly mix the gases.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas mixing device for mixing plural kinds of gases, comprising:

a cylindrical portion including an upper surface which is closed;

a gas outflow passage which is formed in a central portion of a bottom surface of the cylindrical portion, and extends downward;

a plurality of gas stream guide walls which are disposed to be spaced apart from each other in a circumferential direction along an edge of an opening formed by the gas outflow passage in the bottom surface, and which are installed to be rotationally symmetrical to a center of the cylindrical portion, the plurality of gas stream guide walls protruding toward the upper surface; and a gas inlet part installed between the plurality of gas stream guide walls and an inner peripheral surface of the cylindrical portion, and into which a gas to be mixed flows, wherein, when viewed in one direction of a clockwise direction and a counterclockwise direction in the circumferential direction of the cylindrical portion, if the one direction is defined as a front and the other direction is defined as a rear, the plurality of gas stream guide walls guide the gas introduced between the inner peripheral surface of the cylindrical portion and the plurality of gas stream guide walls to the gas outflow passage along outer peripheral surfaces of the plurality of gas stream guide walls, and the plurality of gas stream guide walls is bent toward the center of the cylindrical portion in a front direction so as to form a swirl flow.

2. The device of claim 1, wherein the outer peripheral surfaces of the plurality of gas stream guide walls are formed in an arc shape having a diameter smaller than a diameter of an arc shape of the inner peripheral surface of the cylindrical portion in plan view.

3. The device of claim 1, wherein the gas inlet part is configured to set a gas inlet position on a rear side, relative to the center of the gas stream guide wall, in a front-rear direction.

4. The device of claim 1, wherein the gas inlet part is configured so that the gas flows into the cylindrical portion from an upper surface side of the cylindrical portion.

5. The device of claim 1, wherein inner peripheral surfaces of the plurality of gas stream guide walls are inclined toward the center of the cylindrical portion in a downward direction.

6. The device of claim 1, wherein an inner peripheral surface of the gas outflow passage is inclined toward the center of the cylindrical portion from the opening in a downward direction.

7. The device of claim 1, wherein an inner peripheral surface near a rear end of a first gas stream guide wall among the plurality of gas stream guide walls on the front side and an outer peripheral surface near a front end of a second gas stream guide wall among the plurality of gas stream guide walls, which is adjacent to the first gas stream guide wall, on the rear side face each other, and a space sandwiched between the inner peripheral surface and the outer peripheral surface is configured as a gas stream guide passage forming a swirl flow.

8. The device of claim 1, wherein an inner peripheral surface on a front end side of the gas stream guide wall is an inclined and an inner peripheral surface of a rear end side of the gas stream guide wall is standing more straight than the inner peripheral surface on the front end side.

9. The device of claim 1, wherein the number of the gas stream guide walls is two or three.

10. The device of claim 1, wherein the gas inlet part is installed to each of the plurality of gas stream guide walls.

11. A substrate processing apparatus, comprising:

the gas mixing device of claim 1 in which different process gases are introduced from different positions so as to be mixed;

a processing vessel to which the process gases mixed in the gas mixing device is supplied;

a mounting part installed in the processing vessel, and configured to mount a substrate to be processed by the process gases; and an exhaust part configured to evacuate the interior of the processing vessel.

12. The apparatus of claim 11, wherein the gas mixing device includes one gas inlet part into which a carrier gas and a raw material gas flow, and another gas inlet part into which the carrier gas and a reaction gas reacting with the raw material gas flow, and a process performed in the substrate processing apparatus is a film forming process, the film forming process performing, a plurality of times, a cycle including alternately supplying a mixture gas formed by mixing the carrier gas and the raw material gas introduced from the one gas inlet part with the carrier gas introduced from the another gas inlet part in the gas mixing device, and a mixture gas formed by mixing the carrier gas introduced from the one gas inlet part with the carrier gas and the reaction gas introduced from the another gas inlet part in the gas mixing device to the processing vessel under a vacuum atmosphere in which the substrate is located.

13. The apparatus of claim 11, wherein the gas mixing device includes one gas inlet part into which a raw material gas flows and another gas inlet part into which a reaction gas reacting with the raw material gas flows, and a process performed in the substrate processing apparatus is a film forming process, the film forming process performing a supply of a mixture gas formed by mixing the raw material gas introduced from the one gas inlet part and the reaction gas introduced from the another gas inlet to the substrate.

* * * * *